United States Patent [19]

Masse et al.

[11] Patent Number: 4,956,906

[45] Date of Patent: Sep. 18, 1990

[54] METHOD OF PREPARING PRE-DISTORTED IMAGES FOR DECORATING A SHAPED BLANK

[75] Inventors: Christophe Masse, La Tronche; Michel Philippe, Villaines sous Malicorne, both of France

[73] Assignee: Cebal, Clichy, France

[21] Appl. No.: 279,579

[22] Filed: Dec. 5, 1988

[30] Foreign Application Priority Data

Dec. 1, 1988 [FR] France .................................. 88 16099

[51] Int. Cl.$^5$ .............................................. B21K 21/16
[52] U.S. Cl. .......................................... 413/8; 29/407; 29/17.2; 283/117; 355/52
[58] Field of Search ............... 29/17 R, 401.1, 402.18, 29/402.19, 407, 18; 101/35, 36, 37, 41, 42, 43, 44; 413/78; 283/70, 117; 355/52, 47; 428/34.1, 195; 358/140

[56] References Cited

U.S. PATENT DOCUMENTS

| | | | |
|---|---|---|---|
| 3,314,329 | 4/1967 | Wolbert | 355/52 X |
| 3,445,161 | 5/1969 | Moss | 355/52 X |
| 3,627,412 | 12/1971 | Jean | 355/52 X |
| 4,556,312 | 12/1985 | Vany | 355/47 |
| 4,765,656 | 8/1988 | Becker et al. | 283/70 |

FOREIGN PATENT DOCUMENTS

| | | | |
|---|---|---|---|
| 753446 | 2/1967 | Canada | 355/52 |
| 202928 | 11/1986 | European Pat. Off. | 358/140 |
| 215718 | 3/1987 | European Pat. Off. | |
| 2145843 | 4/1985 | United Kingdom | 355/52 |

*Primary Examiner*—Joseph M. Gorski
*Assistant Examiner*—Peter Vo
*Attorney, Agent, or Firm*—Dennison, Meserole, Pollack & Scheiner

[57] ABSTRACT

According to the invention, the surface of a blank to be shaped into a product is decorated by marking on a test blank a plurality of reference points distributed over the entire surface of the test blank which will be affected by the shaping. The test blank is then shaped into a test product and the positions of the reference points are determined. A block of decoration to be obtained on the product is formed, and the positions of the reference points on the test product are located on the block. The decoration is then converted into a plurality of pixels of each inking color, and the position of each pixel with respect to the reference points on the test product is located. A corresponding pixel position with respect to the reference points on the test blank is also determined, and a film is prepared by printing the film with each pixel of the decoration reproduced in a location corresponding to the corresponding location on the test blank. At least one blank is then decorated with the film.

13 Claims, 8 Drawing Sheets

METHOD OF PREPARING PRE-DISTORTED IMAGES FOR DECORATING A SHAPED BLANK

BACKGROUND OF THE INVENTION

The invention relates to a method of decorating a blank which is to be shaped typically into a hollow packinging element or receptable, and also to the use of this method for the manufacture of bodies of preserves cans and other shaped packaging elements or receptacles, and also to the products obtained thereby.

It is known to decorate a blank which is intended to be shaped into a metal receptance, for example by drawing and ironing in order to obtain a desired decoration on the outside of the shaped receptacle, the prior decoration of the blank taking into account the shaping which this blank is to undergo.

For instance, the document FR-B-2535858 (corresponding to U.S. Pat. No. 4,556,312) describes a device for printing circular blanks intenede to be drawn into cans, according to a predeformed image by an optical method, the optical system comprising a face cut on the basis of the evolutions of distances from points on the lateral surface of the can at the contour of the bottom of the can between the blank and the drawn product.

On the other hand, the document EP-A-0215718 describes a method of and an apparatus for predeforming the printed image decorating a mechanically drawn metal can . For predeformations corresponding to variable elongations due to the drawing of the walls of the can, this articulated bar apparatus uses a template, the bearing edge of which is defined by means of the articulated bar and the distances between successive reference lines on a sample cut into the side wall of a test can.

In turn, the document EP-A-0202928 describes a method in which the predetermined image obtained on the blank is based on computerised conversion of the original rectangular image into an annular image having the same surface area, which is used for printing on the blank. This conversion is based on a calculation of the polar co-ordinates of each point on the annular image of the blak from rectangular co-ordinates of a corresponding point on the original image. A correction according to the anisotropy of the elongation of the blank is alluded to, with no more specific details.

In circular metal preserves cans obtained by deep drawing and which typically have at the bottom a height: diameter ratio greater than 0.5, there are local differences in the elongation of the lateral wall, corresponding to the "drawing ears" phenomenon, and the harder the blank, the more marked this phenomenon will be. These irregularities appear towards the top of the cans and are reflected in deformations of the decoration, lines (marks, characters, figures) or designs situated at this level. In the case of cans which have a non-circular contour, for example so-called rectangular cans, there are also considerable localised irregularities arising from contraction of the wall parallel to the bottom and which can be superimposed on the aforementioned irregularities in elongation.

The three prior art methods mentioned hereinabove apply one and the same predeformation to all points of the drawn product which are situated at the same level. They do not make it possible to correct the previous irregularities, which in practice leads either to avoiding excessively anisotropic materials or to tolerating distortions or inaccuracies in the decor of the drawn product in relation to the desired decor, or yet in adopting flat tin areas in the zones which are sensitive to the aforesaid irregularities.

The Applicants have sought to perfect a method of decorating the blank which makes it possible to overcome such irregularities and the constraints and imperfections associated with them.

DISCLOSURE OF THE INVENTION

A first object of the invention is a method of decorating a blank of a product which is to be shaped by a chosen process and in which, according to the principles known from the document EP-A-0215718:
(a) a test blank is chosen and reference points are marked on it:
(b) this test blank is shaped into a shaped product by the said method and the position of the said reference points on the shaped product is determined;
(c) a block of the decor to be obtained on the shaped product is taken and positioned with respect to the said positions of the reference points on the shaped product;
(d) at least one film of the decor on the blank or "blank film" is prepared taking into account the evolution of the said reference points between the said test blank and the said shaped product;
(e) at least one blank is decorated by means of the said blank film(s).

According to the invention:
(a') in stage (a) the reference points are distributed over the entire surface of the test blank which is to be affected by the shapping into a shaped product, their number and their distribution being such that it is possible to determine the evolution of the position of any point on this surface at the time of shaping, by means of a referencing of this position in relation to a plurality of the reference points;
(d') and according to stage (d):
 (d'$_1$) the decor of the said block is converted into pixels of each inking colour;
 (d'$_2$) the position of each of these pixels is referenced in respect of the positions of the reference points on the shaped product, and the corresponding position is referenced in respect of the reference points on the test blank;
 (d'$_3$) the blank film or films is printed with each of the inking colours according to the said corresponding positions of the said pixels.

The decorated blanks in one production batch and their shaping tools being constantly oriented in relation to a characteristic direction of the starting material, for example in respect of the direction of rolling of the metal strip from which these blanks are cut, the Applicants have noticed that the elongation and contraction irregularities in the products shaped from these blanks were reproducible in size and in position. From this, they deduced that precision monitoring of the deformations of the points of the zones of irregularity, by for each point on this zone or these zones referring to sufficiently close reference points in these zones and by interpoliting between these reference points in the same way before and after shaping, would make it possible to carry out a precise predeformation anywhere over the decor. The position of the reference points is first of all accurately monitored on the blank and after deformation, typically by means of a metrological device with an absolute precision better than 0.04 mm. The principle of interpolation between the reference points is then applied to the pixels themselves in the inverse transformation of the decor.

The aforementioned method is applied also to the other zones of the shaped products, here referred to as "semi-homogenous zones", because in each the transverse contractions (i.e. contractions of the wall parallel with the zone or bottom of which the contour remains constant) are constant at every level and the variable longitudinal elongations (i.e. elongations of the wall at right angles to the bottom) remain the same over the width of the zone. The reference points may be less close together in the direction of the width, which will not adversely affect the accuracy of the preceding interpolations.

In practice, very good degrees of reproducibility of the decor of the shaped part in relation to the original decor or the decor on the block provided by the client are obtained: typically at better than 0.2 mm over a width of 50 mm (i.e. upon superposition of the block, there is no local offset which exceeds 0.2 mm) or better than 0.3 mm over a width of 100 mm.

To this end, it is advisable to use reference points on the blank which are spaced apart by at most 5 mm and preferably 3.5 mm, along longitudinal straight lines perpendicular to the contour which is not deformed by the shaping or at more than 45° in respect of this contour, and by at most 15 mm and preferably 10 mm along straight lines which are parallel with or less than 45° in relation to the parts of the said contour which have a radius of curvature exceeding 35 mm.

For facility of preparation of these reference points and the scanning of their position after shaping, carried out for example by an operator assisted by an optical device, these reference points are preferably linked to a grid of lines or carried by such a grid, as is known per se. This grid is advantageously composed of lines which at the bottom are perpendicular to the non-deformed contour or contour of the bottom of the receptacle, and lines which are parallel with this contour, the spaces between the former taking into account contractions of the wall of the shaped product, while the spacings between the latter then take into account elongations at right angles to these contractions.

Preparation of the blank film or films by inverse transformation applied to the pixels of the decor is preferably carried out under the following conditions:

(d'₁) the decor block to be obtained is translated into colour data digitalised and marked by means of an image scanning device, for example a high resolution camera or scanner; these data are entered into an image processing data system and, in this system, the colour data of the block are converted to pixels of each inking colour;

(d'₂) all these data are transferred to a computer where each of these pixels has its position marked in relation to the reference points on the shaped product, for example the intersections of a grid of lines, then by interpolation, typically by means of an algorithm driven by the computer, the starting position corresponding to this marked position of the pixel in relation to the reference points on the test blank is determined and a decision is taken as to the colouring or not of the pixels surrounding this position in the line system of the printing.

The blank film or films of each of the inking colours being printed according to the starting positions of the pixels thus determined, the decoration of the blank or blanks by means of the film or films is carried out by a prior art printing process, for example wet offset printing.

During the course of the tests carried out on rectangular aluminium alloy preserves cans, it was noticed that although the motifs in the decor were reproduced with considerable accuracy, thanks to the method according to the invention, there were on the other hand significant lightenings of the colours in the upper part of the corner zones of the resultant cans. The Applicants observed that the thus lightened areas were cosiderably contracted parallel with the bottom and by means of reference grid transformation, they determined that the surface of some of the meshes was as a whole reduced, which aggravated the lightening effect.

The following simplified explanation is proposed: when the transformed width is smaller than the starting width, the inverse transformation of the coloured pixels leades to blank pixels not filling up this starting width, and the direct transformation of the blank into a receptable leads to a lightening due to the spaces between these deformed blank pixels.

The smaller the radius of curvature of the bottom contour, the more marked such linear contractions will be, and the more significant will be the level of the zone or mesh in question in relation to the bottom so that generally speaking the radio or level h:2R in which:

h is the height of the zone in question on the shaped product in relation to its bottom or its portion of which the contour is not deformed;

R is the radius of curvature of the non-deformed contour directly below the zone in question;

is a good criterion.

In the case of aluminium alloy metal preserves cans, the linear contraction ratios depend on this ratio h:2R, typically as follows:

| h: 2R | Approximate contraction ratio |
|---|---|
| 0.3 | 1.5 |
| 0.5 | 1.7 |
| 0.8 | 2 |

To avoid the above lightening effects and in order to improve the rendering of the colours and markings in the zones which are contracted by the shaping process, it has been found effective to sub-divide the coloured pixels in the decor carried by the block at the moment (preferential stage d'₂) of the decision to colour the pixels for printing of the blank film, at least for the portions of the blank which correspond to a ratio h:2R in excess of 0.5.

This sub-division of the coloured pixels of the decor is effective when carried out according to the direction of contraction of each contracted zone, and the ratio of sub-division is then preferably equal to the whole number immediately above the maximum contraction ratio of the shaped product in the zone in question.

Thus, and this is quite usual in decorations of preserves cans, the height of the decor may include zones which have a h:2R ratio of between 0.5 and 1 and in order to obtain an excellent rendering of the colours and markings everywhere over the decor, the method of the invention is applied by sub-dividing the pixels in the decor on the block in the computer with a sub-division ratio of 2 in the direction of contractions, at least for any portion of h:2R exceeding 0.5 and better still for any portion of h:2R which exceeds 0.3.

In the practical execution of the method, measurements at the reference points before and after shaping, measurements which are characteristic of the geometry of the shaped product, the method of shaping and the quality of blank used, are extremely precise and rather prolonged and may for example take up to four hours. On the other hand, preparation of the blank films from a new decor block is quick, for example taking 30 to 45 minutes, thanks to the scanning and computing means employed. Therefore, changes of decor are vastly facilitated.

A second object of the invention is the use of the method in cases where such use proves to be particularly advantageous: firstly for the manufacture by a drawing or drawing-ironing process of bodies of decorated preserves cans which consist of aluminium or alloy or tin, the can bodies which are drawn in tin having the same types of irregularity as the can bodies which are drawn in aluminium or alloy. As illustrated in the examples, the irregularities linked with anisotropy are marked in case of such aluminium alloy preserves can bodies in which the decor attains a h:2R level in excess of 0.5 when these can bodies are drawn from blanks with a breaking load in excess of 260 MPa, and the use of the method according to the invention is then indipensable in obtaining satisfactory reproduction of the markings and motifs of the decor on the block. The use of the method is likewise advantageous for all cases where shaping in the plastic state to produce a shaped product, generally a receptacle, gives rise to localised irregularities in deformation in the direction of elongations and/or contractions, and particularly in the case of blanks which consist of a plastics material shaped by forming under heat, the shaping temperature being limited by the colour content of the decor and being typically comprised between 150° and 200° C. The use of the method likewise has considerable interest for the manufacture of receptacles from a plastics or metalloplastics multi-ply material which is shaped by drawing, for the manufacture of hollow aluminium or alloy receptacles in a thickness of less than 0.18 mm (typically comprising a drawing stage), and for the drawing-ironing production of metal or metal-based capsules, for example of Al, Pb or Pb/Sn, tinplate, metal/polyolefin, their skirts being decorated by colour motifs and/or lines.

A third object of the invention is the products obtained and firstly the bodies of drawn or drawn-ironed decorated preserved cans produced in a single piece, the decor on which comprises zones with an h:2R level exceeding 0.5, these can bodies being remarkable by reason of their very high rendering of colours and markings everywhere, both at the top of the skirt (the top part of the decor) and at the bottom of the skirt. The difference over prior art can bodies, possibly established with the help of enlarging means, is very clear. It is even more marked if the can body is a drawn product which has been drawn even more deeply, the decor comprising zones with a h:2R ratio exceeding 0.8, the excellent quality at all points of the decor remaining, including the rendering of the colours due to the measure of subdividing the pixels. In each of these two cases, the can bodies are typically of aluminium or alloy or tin. The bodies of aluminium or alloy cans are then distinguished also by their hardness and possibly their reduced thickness, for example over 330 MPa of breaking load and possibly a skirt thickness which is less than or equal to 0.23 mm, conditions which could not be used in the prior art on account of the excessive irregularities of deformation for the decor.

According to its third object and secondarily, the invention also relates to a one-piece receptacle shaped from a decorated blank having a lateral decor comprising zones having a h:2R level at least equal to 0.5 and often exceeding 0.8, the rendering of the colours and the markings of this decor being good at any level of the said decor, the said receptacle being either of metalloplastic or plastic multi-layer material, or being of aluminium or an alloy of a thickness less than 0.18 mm. The use of a previously decorated blank and the irregularities in deformation linked with the shaping may be established by observing the grids, for example with an enlargement of 10 to 30.

According to its third object and thirdly, the invention also relates to a metallic or plastic metal capsule, for example one of the kinds indicated hereinabove, drawn or drawn and ironed in one piece from a decorated blank, the skirt of this cap being decorated by colours motifs and/or markings, the decor of this skirt comprising zones with a h:2R level at least equal to 0.8, the rendering of the colours and the markings on this decor being good at any level of this decor. The cap is then typically an over-stoppering cap with a previously decorated skirt, which is novel.

ADVANTAGES OF THE INVENTION

To sum up, the advantages of the invention are as follows:

the decor of the block is obtained on the shaped part with excellent conformity, typically better than 0.2 mm for texts and markings and with an excellent rendering of colours and markings at all points, whatever are the irregularities inherent in the shaping and the quality of the blank, the accuracy of this reproduction emanating from application of the predeformation to the pixels themselves, these latter occurring typically at the rate of 200 to 900 pixels/cm;

fidelity of shades in all four-tone reproductions, even in the zones of considerable contraction due to the imaginary modification of the pixels;

ease of changing decoration, correspondences between points on the blank and their values transformed by the shaping and the interpolation and inverse transformation of the pixels of the various colours having already been established;

the possibility of using blanks of widely diverse quality, particularly of more economical grades;

the possibility of using blanks of aluminium or alloy or tin which are harder and therefore more anisotropic and possibly thinner, the aim being for example to retain the same rigidity in the bodies of the cans;

considerable economies achieved by such reductions in thickness, typically attaining a relative 10 to 15%.

BRIEF DESCRIPTION OF THE DRAWINGS

The drawings have been prepared with photocopies of the objects in question.

DETAILED DESCRIPTION OF THE INVENTION

1. Effect of the hardness of the irregularities and deformation

Stocks were acquired of strips of aluminium alloy 5052, reference of the Aluminium Association, in one and the same thickness of 0.25 mm and in two conditions H24 and H28. The alloy 5052 contains about 2.5% Mg and 0.25% Cr. The respective mechanical resistances of the two conditions were:

(H24) breaking strain 240 MPa and elastic limit at 0.2% 187 MPa;
(H28) breaking strain 285 MPa and elastic limit 248 MPa.

Figure 2:
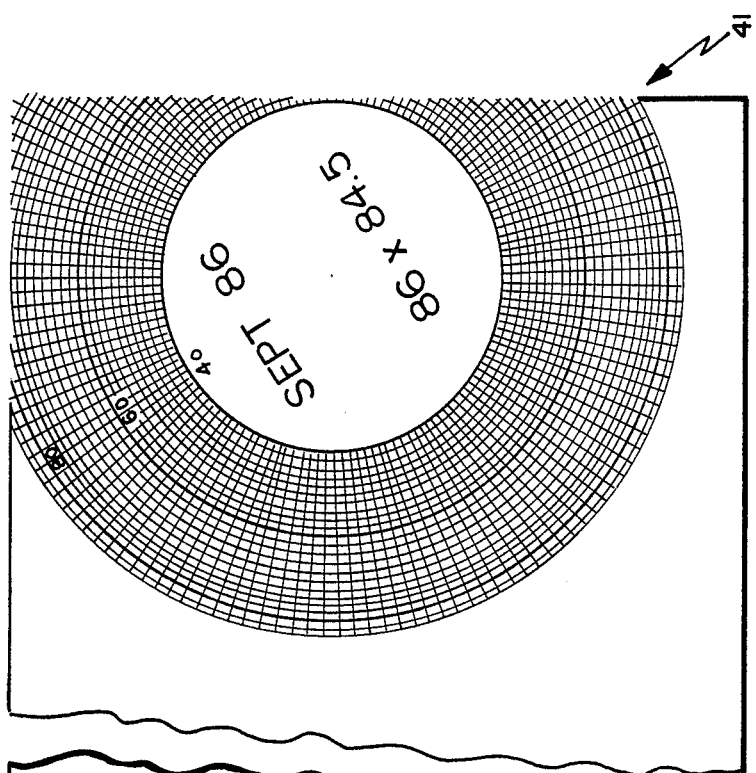
FIGS. 1 and 2 show partly the bottoms of two circular deep drawn can bodies and FIGS. 1b and 2b show part of their respective skirts.
Figure 1:
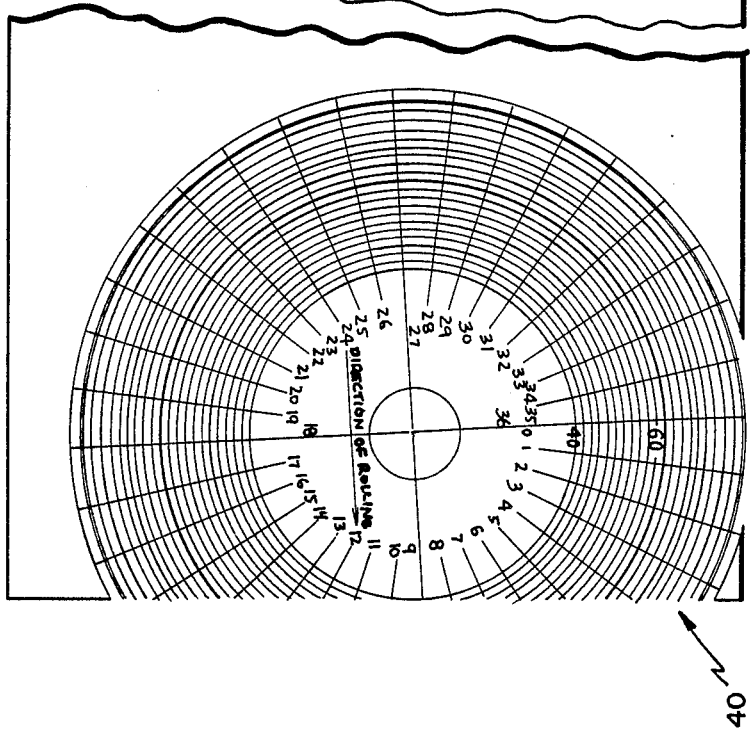
Figure 2B:
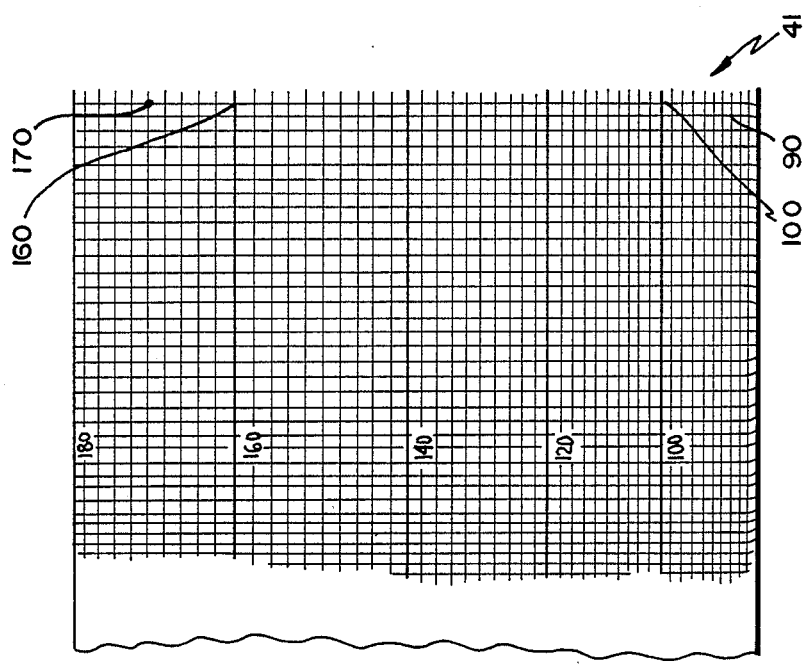

A blank of each type bearing equidistant concentric reference lines 1 mm apart and radial lines was drawn and ironed into a can body having a diameter of 46 mm at the bottom and a height of 84.5 mm. The bottoms of two cans 40 and 41 are shown in FIG. 1 (a blank of condition H28) and in FIG. 2 (H24) and comparable portions of their respective skirts are shown in FIGS. 1b and 2b.

It is possible to see the progressive increase in the elongation of the skirts, the divergence of the levels close to the bottom, marked "90 " and "100 " (FIG. 2b) being 6 mm while the divergence of the levels "160 " and "170 " situated towards the top of the skirt is 10 mm.

Figure 1B:
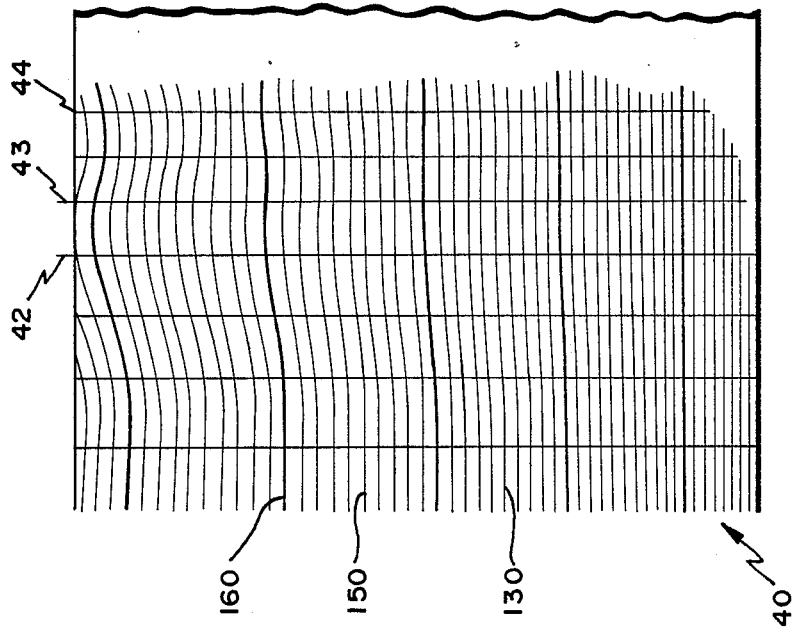

On the skirt in FIG. 1b, corresponding to the hardest blank, one can see very visible anisotropy deformations with effect from the level "150 " corresponding to a ratio h:2R of 50/86=0.58 and already apparent a little lower down as from level "130 " (h:2R=0.35). These irregular deformations produce a maximum elongation zone centred over the vertical generatrices 42 and 43, with "waves" or variations in elongation which are of lesser importance in the vicinity of the vertical generatrix 44 and of the circular line 160 (FIG. 1b).

Two points may be noted:

the method according to the invention makes it possible to obtain an exact decoration at the top of the skirt in the case of the can 40 for which the anisotropy is marked, whereas the prior art methods do not permit this:

it is then possible to start with a thinner blank, the thickness making it possible to obtain the same can rigidity since it can be determined experimentally and then divided by a ratio comprised between the ratio of the breaking loads and the ratio of the elastic limits of the blanks.

2. Tests on rectangular aluminium alloy cans: deformations

The blanks used for these tests were cut from the same strip as the blank of the can 41 (5052- H24 thickness 0.25 mm).

Figure 3:
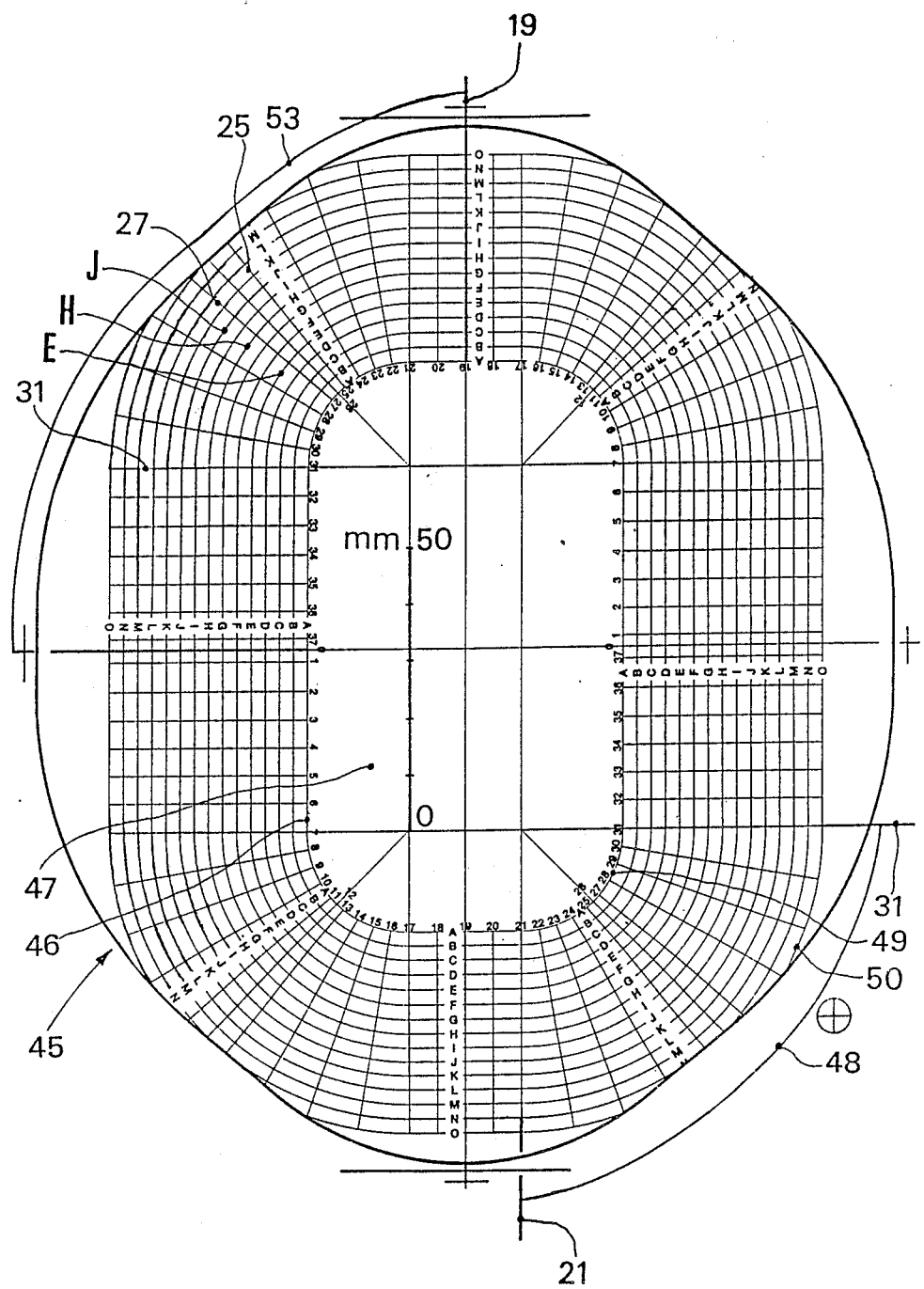
FIG. 3 shows the test blank of a rectangular can body.

FIG. 3 shows a test blank 45, the contour 46 of the bottom 47 being of the rectangular type with corners ¼-round with a radius of 18 mm, long sides measuring 64 mm and short sides measuring 20 mm between these rounded corners, the length and total width of the bottom and also of the body of the can being respectively 100 and 54 mm.

The reference grid is based on the contour 46 of the bottom 47. It comprises lines parallel with this contour 46 and spaced apart by 2.5 mm and straight lines starting at a right angle to this same cotour 46. This mesh is mixed having rectangular meshes directly over straight sides of the contour 46 and of a polar type in the corner zones such as 48. The lines at a right angle to these polar mesh portions 48 are radial, passing through the centre of the corresponding quarter-circle 49 and being limited by extreme radii 21 and 31 of this quarter-circle 49 with a 10° spacing giving a divergence of 10 mm over the circumference 50.

Figures 4, 5:
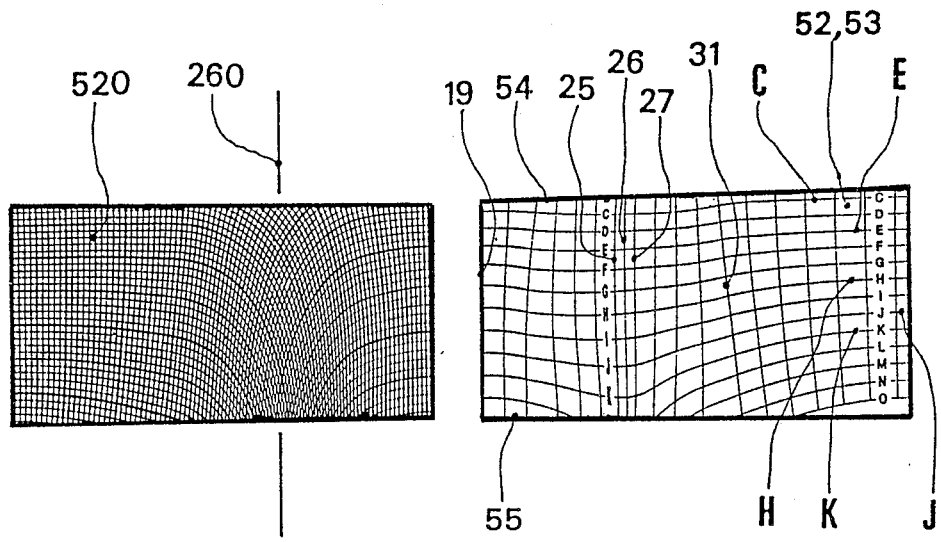
FIG. 4 shows a portion of the skirt of the product shaped from this blank.
FIG. 5 shows a portion of a similar skirt obtained from a blank carrying a millimetric grid of square meshes.

This test blank 45 has been shaped by a drawing-ironing process to produce a can 51, is bottom 47 then being stiffened by reliefs and ribs which do not affect the geometry of its contour 46 and its portions outside the contour 46 are turned down and drawn to form a skirt 52 surmounted by a stepped returned edge. FIG. 4 shows a portion 53 of this skirt corresponding to the portion 53 of the blank shown in FIG. 3, its edge 54 at the top of the drawing being close to the contour 46 at the bottom of the can and its edge 55 at the bottom of the drawing being close to the end of the skirt 52. The almost vertical line 26 marks the middle of the rounded corner zone comprised in the sample 53 and extending substantially from its left hand edge 19 to the line 31 of extreme radius 31 of the blank (FIG. 3). The elongations marked by the divergences between the peripheral lines such as J and K increase more and more going from the bottom 54 of the sample 53 towards the upper edge 55 of the sample 53 (at the bottom in the drawing). These increases in elongation are maximal in the central part of the corner zone and are centred on its median line 26. They are visible from the bottom of the sample (line C).

In this corner zone 19 to 31, there are not only elongations of the meshes which increase from the bottom 54 towards the top 55 of the skirt 52 but also peripheral contractions which increase as far as the median line 26 on either side of this line 26. The peripheral widths of the meshes may be compared with their original widths or widths on the test blank 45 at 3 different levels:

width (25, 27) at the level of the line E at 11 mm from the bottom (i.e. h:2R=0.3):=3.5 mm for an initial width of 3.6 mm;

width (25, 27) at the level of the line H at 20 mm from the bottom (h:2R=0.55):=3.4 mm for an initial width of 6 mm;

width (26, 27) at the level of the line J at 30 mm from the bottom (h:2R=0.83):=3.2 mm for an initial width of 7 mm.

In these last two cases, the peripheral contraction ratios are thus 1.76 and 2.19.

It is interesting also to compare the referencing of deformations by the mixed mesh in FIG. 4 with the referencing by the deformations of a mesh having square millimetric meshes of the sample in FIG. 5. This sample of skirt 520 is cut out on either side of a rounded middle 260 and corresponds to a symmetrical position of this on the sample 53 in respect of its median line 26. This mesh which does not follow the contour 46 of the bottom (FIG. 3) leads to a crossing of lines on the imaginary line through rounded middle 260 which permits of marking but which makes reading and organisation of correspondence of reference points markedly more difficult than with the reference lines in FIG. 4.

3. First test of shaping after decoration according to the method of the invention, perfection of a correction in the contracted zones.

Chosen as reference points are the intersections of the meshing in FIG. 3. The test blank was shaped into a rectangular can body of the already-described geometry. The position of the reference points in relation to the bottom contour was determined with an accuracy of 0.02 mm by means of an optical metrology device. Then a quadrichromic decor block was made up and was positioned in respect of the can body in such a way that it occupied all the straight height of the skirt with the exception of 3 mm at the top and 3 mm at the bottom, in other words a decor height of 37 mm. A plurality of blanks which are identical in nature, geometry and orientation to the test blank 45 were decorated by means of 4 colour films prepared by the method according to the invention, that is to say by inverse transformation of the positions of the pixels on the block decor, each of these positions being precisely referenced by interpolation within the mesh in which this position is situated. To do so, a scanner was used to analyse the image of the block, and a computer and a printing scanner were also used, the scanners showing successions of 720 pixels per cm.

Better reproducibility of the markings and of the contours of the motifs in the decor were obtained but it was noticed that in the rounded portions of the corners of each can there was a lightening of the colours manifest with effect from 15 to 20 mm height above the bottom and even more visible as one approached the top of the decor. The successive tests confirm this localisation of the lightening effect, commencing mildly from 10 to 12 mm from the bottom and only affecting the rounded corner zones of the cans.

It was then thought that these lightened areas had some link with the peripheral contractions of the rounded zones and the evolution of series of meshes in the shaping was determined. Given here as an example is the evolution of the meshes of the sample 53, comprised within the lines J and K and within the substantially vertical lines 25 and 36, the measurements having been carried to scale 4.

In the attached Table 1, the first mesh under consideration (J,K/25,27) is divided into two equal parts by the mediam line 26. Measurements of peripheral width and height of the meshes after shaping, deformed substantially into trapezia between the lines 25 and 31, are averaged in amount, the products of width×height then being equal to the surface area of the mesh. Table 1 makes for the following observations:

the meshes of the can body are all drawn in the direction of the height, slightly over the large lateral faces of the skirt, and far more markedly in the rounded corner zone: the height is doubled for meshes J,K/25,27 and 27,28;

all the can body meshes are contracted according to their width (peripheral contraction), slightly in the centre of the large lateral face (5%), increasingly so in the radiussed corner zone, the width being divided by 2.4 for the middle mesh of radius J,K/25,27;

the values in the Table make it possible to put figures to the observations already made in respect of FIG. 4. The surface areas of the meshes under consideration before and after shaping are shown therein as are also the ratios of the surface areas. These surfaces are slightly increased by 2 to 12% on the large lateral face of the skirt, that is to say for meshes J,K/31,32 to 35,36. The surfaces of the meshes are in contrast reduced or contracted, with a correlative increase in local thickness, in the radiussed corner portion, the ratio of contraction of surface area attaining 1.23in the median mesh J,K/25,27.

Over and above the peripheral contractions and the contractions of surfaces of meshes J,K/30,31 to 25,27, the points of which are at levels of ratio h:2R of between 0.55 and 0.9, it is possible to note slight variations in the peripheral contraction and elongation connected with the actual drawing on the large faces of the shaped skirt. The procedure according to the invention makes it possible very faithfully to reproduce a decoration at any point despite such fluctuations.

EXPLANATION OF THE LIGHTENING EFFECTS NOTICED—REMEDY

Figure 6:
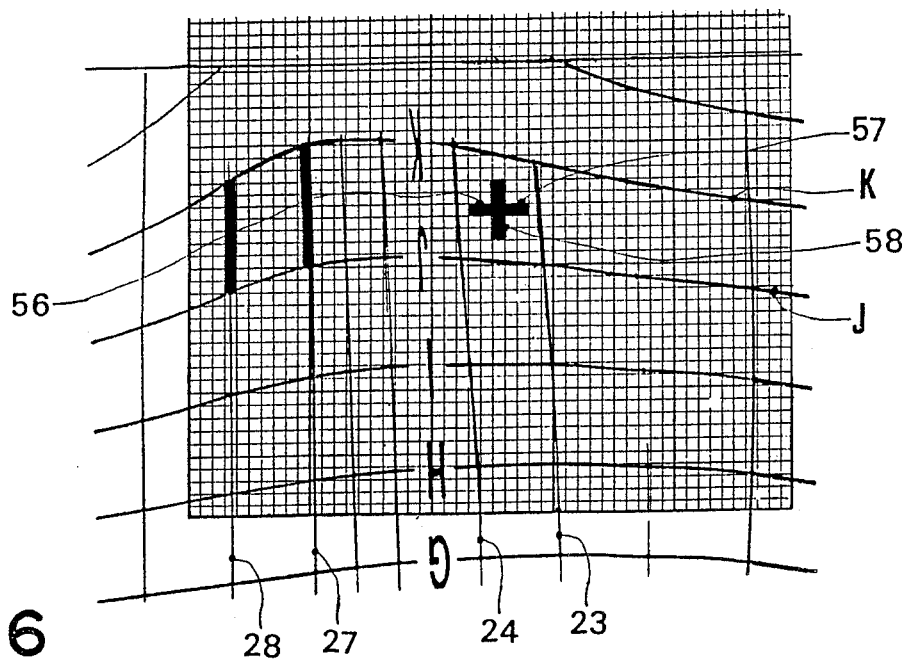
FIGS. 6 and 7 show corresponding parts of the shape of the aforementioned shaped product and blank, equipped with tracings marked out in millimetres which make it possible to diagrammatise the inverse transformation of the pixels.
Figure 7:
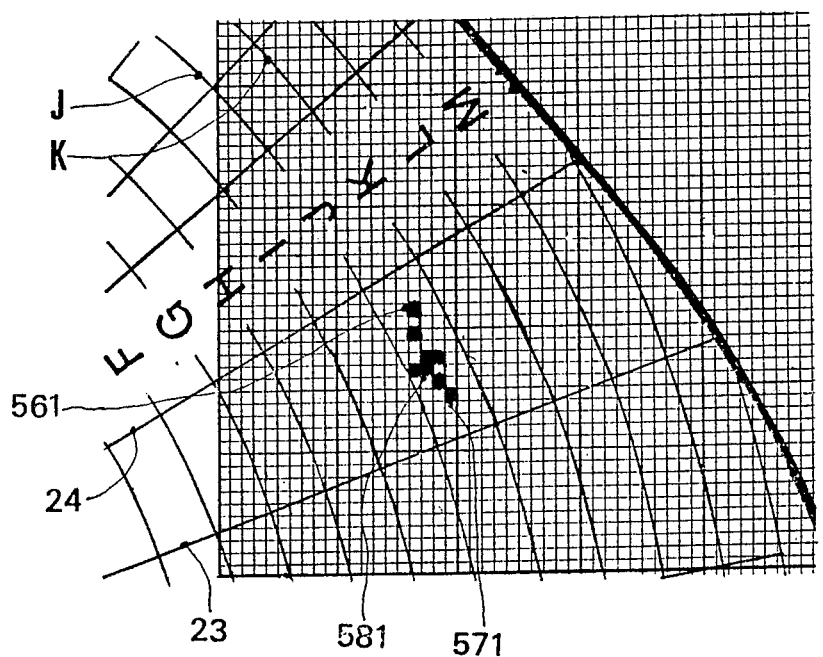

Overlaid on the mesh J,K/23,24 equal and symmetrical to the mesh J,K/27,28 in relation to the line 26 was a piece of tracing paper with a close grid diagrammatically showing the succession of pixels, both on a reproduction of the enlarged shaped state (FIG. 6) as well as on a partial reproduction of the blank (FIG. 7).

On the tracing relative to the decor on the block was placed a cross diagrammatically indicating the succession of 5 pixels according to the width and 5 pixels with a common central pixel in the direction of the height, each pixel being here a small square mesh on the tracing.

Starting from the precise position of each pixel 56 in the horizontal bar of the cruciform motif in relation to the peaks of the mesh J,K/23,24, corresponding and precise position in the mesh J,K/23,24 of the blank was determined and the small square of the tracing surroundings this position was marked, this square spot or point 561 then being the point corresponding to the pixel 56 according to the method of the invention.

The 5 pixels 56 to 57 on the horizontal bar of the original decor have thus been changed to 5 pixels 561 to 571 situated in the corresponding mesh on the blank which is 2.2 times wider than the same shaped mesh. The succession of these 5 pixels comprises 3 marked empty spaces between each of the first four pixels from the left and its neighbour.

The inverse conversion of the 4 supplementary pixels of the vertical bar fills only one of the 3 preceding spaces by the pixel 581 (FIG. 7) originating from the starting pixel 58 (FIG. 6). All in all, spaces will remain after the inverse transformation of all the pixels of the mesh.

Thus it is possible to avoid such spaces connected with the inverse transformation of pixels of the decor of the block for a contracted zone by imaginarily subdividing these pixels for this transformation. Thus, these pixels were divided by 2 for the zones directly aligned with the radii according to the peripheral direction of the can body, that is to say that on the diagram in FIG. 6 each small square representing a pixel was divided into 2 rectangles the central positions of which situated at ¼ and at ¾ of the width of the small square were taken into account for the inverse transformation as two pixels were involved. This correction was applied to the entire height of the decor in the radiussed surfaces, the correction having no effect where it is pointless, so that this simplification which tends towards safeguarding quality may well be adopted.

4. Tests on rectangular cans

The method according to the invention, improved by the correction of sub-division of pixels, was tested with portions of decor chosen for their sensitivity to slight distortions, placed astride the corner portions of the can shaped from a test blank 45.

Figure 8:
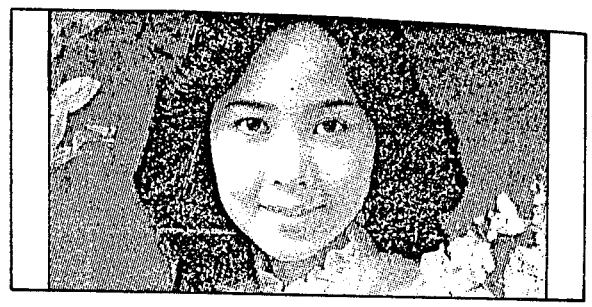
FIG. 8 shows a print from an original block forming part of the decor to be produced in the test.

FIG. 8 shows a decor consisting of a woman's head, 45 mm high and 83 mm wide, disposed about a corner of the shaped box, going then from the middle of a short side to 10 mm after the middle of a long side. Similarly, a decor of markings or letters is arranged in the same way around the opposite corner of the can.

Figure 9:
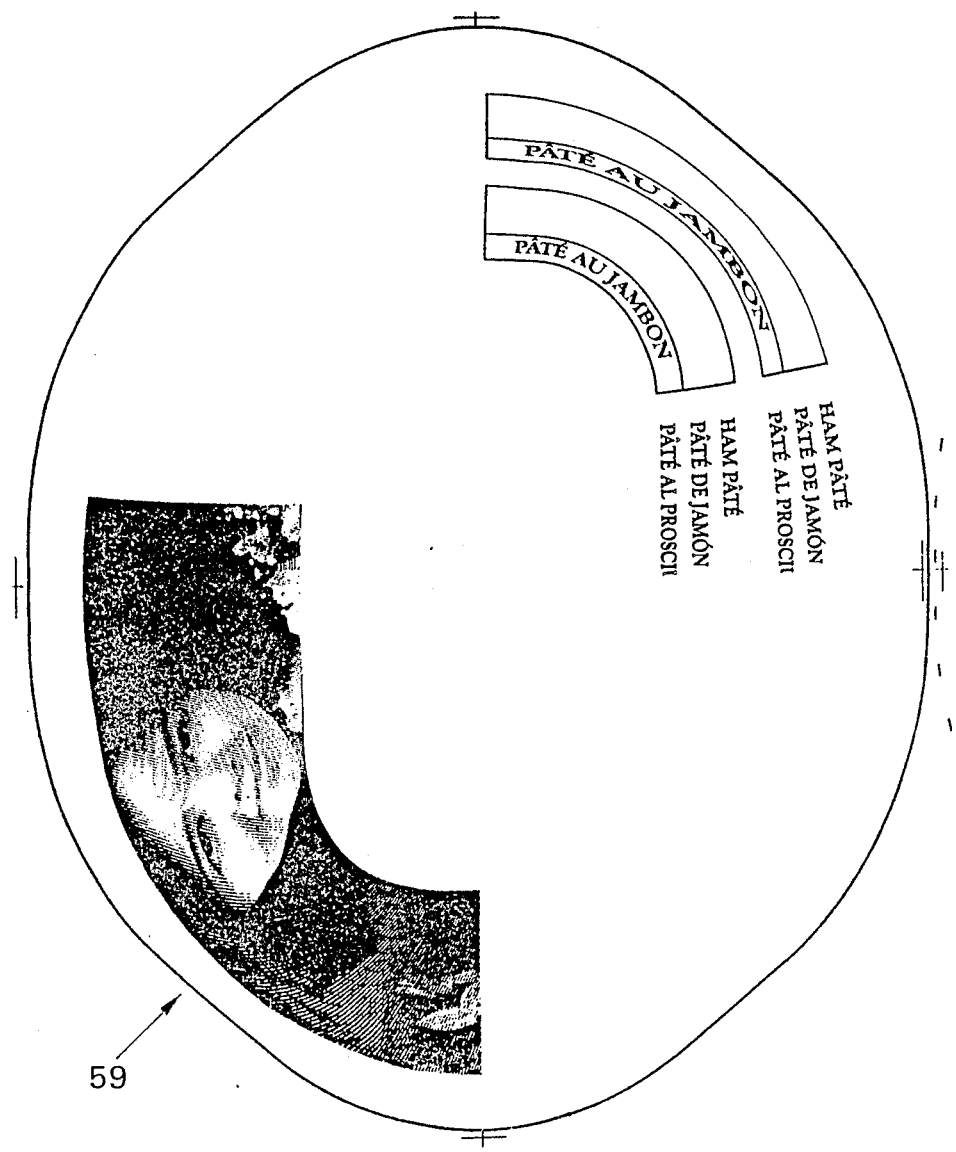
FIG. 9 shows the decorated blank.

FIG. 9 shows these decors after predeformation according to the invention and after they have been printed on a blank 59.

Figure 10:
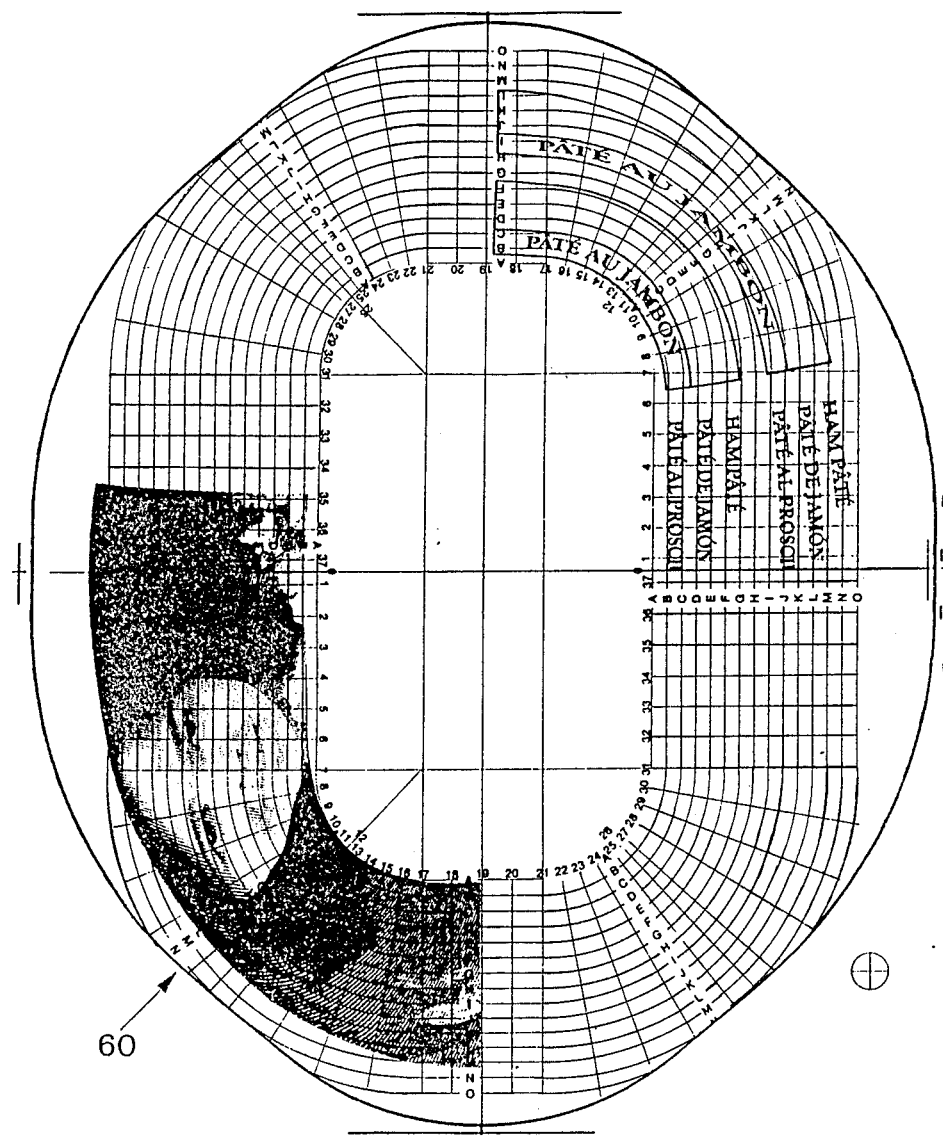
FIG. 10 shows a blank decorated in the same way carrying the grid pattern of the test blank for reference of the decor elements.

FIG. 10 shows the same decors printed on a blank 60 carrying the reference meshing.

Figure 11:
FIG. 11 represents part of the decor obtained after shaping, corresponding to the decor to be produced and shown in FIG. 8

FIG. 11 shows a photocopied reproduction of a part of the woman's head decor of a can obtained from a blank such as 59.

Figure 12:
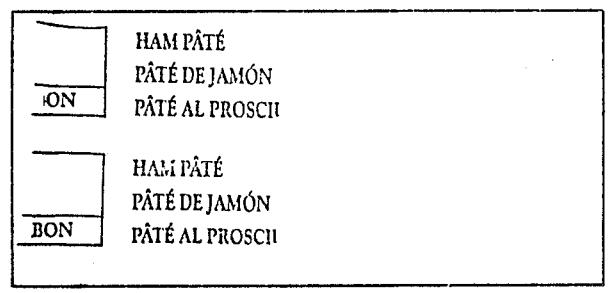
FIG. 12 shows another portion of the decor abtained after shaping.

FIG. 12 shows similarly the opposite part of the decor of the same can, carrying inscriptions.

It can be seen that the woman's head decor (FIG. 11) is in accordance with the original block and shows no lightening of its upper or left hand part, disposed in a radiussed portion with h:D exceeding 0.8. It will also be seen (FIG. 12) that the markings and inscriptions are correctly shown.

APPLICATION

The invention can be applied to all decorated packagings obtained by shaping of a blank and particularly to the preserved foodstuffs industry.

TABLE 1

| Mesh J, K/ . , . | 25,27 | 27,28 | 28,29 | 29,30 | 30,31 | 31,32 | 32,33 | 33,34 | 34,35 | 35,36 |
|---|---|---|---|---|---|---|---|---|---|---|
| Blank | | | | | | | | | | |
| width (mm) | 7,25 | 7,25 | 7,25 | 7,25 | 7,25 | 5 | 5 | 5 | 5 | 5 |
| height (mm) | 2,5 | 2,5 | 2,5 | 2,5 | 2,5 | 2,5 | 2,5 | 2,5 | 2,5 | 2,5 |
| surface area (mm$^2$) | 18,12 | 18,12 | 18,12 | 18,12 | 18,12 | 12,5 | 12,5 | 12,5 | 12,5 | 12,5 |
| Can | | | | | | | | | | |
| width (mm) | 3,0 | 3,25 | 3,7 | 4,5 | 5,25 | 4,2 | 4,25 | 4,4 | 4,75 | 4,75 |
| height (mm) | 4,9 | 5,0 | 4,2 | 3,55 | 3,25 | 3,2 | 3,0 | 3,0 | 3,0 | 2,75 |
| surface area (mm$^2$) | 14,7 | 16,2 | 15,5 | 16,0 | 17,06 | 13,4 | 12,75 | 13,2 | 14, | 14,06 |
| Blank width can width | 2,4 | 2,2 | 1,96 | 1,6 | 1,4 | 1,21 | 1,18 | 1,13 | 1,05 | 1,05 |
| Surface area (blank) surface area (can) | 1,23 | 1,12 | 1,17 | 1,13 | 1,06 | 0,93 | 0,98 | 0,94 | 0,88 | 0,89 |

We claim:

1. A method for decorating the surface of a blank to be shaped into a product, comprising the steps of:
   (a) locating on a test blank a plurality of reference points distributed over the entire surface of the test blank which will be affected by shaping;
   (b) shaping the test blank into a test product and determining new positions of the reference points, each said new position corresponding to a reference point on the test blank;
   (c) forming a block of a decoration to be obtained on the product, and locating on the decoration the new positions of the reference points on the test product;
   (d) converting said decoration into a plurality of pixels of each inking color, and determining the position on each pixel with respect to the new position of a reference point;
   (e) relocating each said pixel with respect to each other individually, from a new position to the corresponding reference point on the test blank;
   (f) locating on a film a plurality of reference points corresponding to the reference points on said test blank, and printing said film with each pixel of the decoration reproduced in a location corresponding to the reference point on the test blank to which the pixel was relocated, thereby forming a film blank; and
   (g) decorating at least one blank with said film blank.

2. The method according to claim 1, in which the test blank comprises a portion having a contour which is not deformed by the shaping process and in which the reference points are spaced apart over the said film by at most 5 mm according to straight lines at right angles to or at most at an angle of 45° to the contour, and not more than 15 mm along straight lines parallel with or at an angle of at least 45° in respect of the parts of the contour which have a radius of curvature less than 35 mm and directly below the parts.

3. The method according to claim 2, in which the reference points are linked to or are carried by a meshing of lines carried by the test blank, comprising lines perpendicular to the contour unaffected by the shaping and lines which are parallel with the contour.

4. The method according to claim 1, 2, or 3, wherein:
   the step of converting said decoration is carried out by translating said block to data by means of an image scanning device, entering the data into an image processing data system, converting the data to pixels of each inking color, and
   the step of locating each pixel is carried out by transferring the data to a computer where each of the pixels has its position marked in relation to the new positions reference points on the test product, then by interpolation, determining the position on the test blank corresponding to the location of each pixel, and deciding whether to color the pixels surrounding the corresponding position in the number of lines to the inch in the decorated blank.

5. The method according to claim 4 for the manufacture of receptacles from synthetic plastics material, shaped by forming under heat.

6. The method according to claim 4 for the manufacture of receptacles from a metalloplastic of plastics multi-layer material shaped by a drawing process.

7. The method according to claim 4 for the manufacture of receptacles from aluminum or alloy and having a thickness of less than 0.18 mm.

8. The method according to claim 4 for the manufacture of metal or metal-based caps by drawing-ironing, their skirts being decorated by colourred motifs and/or lines.

9. The method according to claim 4 for the manufacture of preserved food can bodies from aluminium or alloy or tinplate by drawing or by drawing-ironing.

10. The method according to claim 9 for the manufacture of bodies of cans for preserved foods and from aluminium alloy, in which the decor comprises zones of an h:2R ratio exceeding 0.5, from blanks having a breaking load in excess of 260 MPa.

11. The method according to claim 4, in which the coloured pixels of the decor carried by the block are sub-divided at the moment of the decision concerning colouring of the pixels for printing of the film blank, at least for the portions of blank corresponding to a ratio h:2R greater than 0.5 in which h is the height on the shaped product in relation to its non-deformed portion of contour and in which R is the radius of curvature of the contour directly below each of the portions of h:2R greater than 0.5 in order to improve the rendering of the colours and the markings in the zones which are contracted by the shaping.

12. The method according to claim 11, in which the sub-division of the coloured pixels of the decor is carried out according to the contraction direction of each contracted zone, according to a ratio equal to the whole number immediately above the maximum contraction ratio of the shaped product in the zone.

13. The method according to claim 12, in which the maximum ratio h:2R is between 0.5 and 1 for the decorated portions of the transformed product and in which at least the sub-division of the coloured pixels is carried out for all the portions of the blank corresponding to a ratio h:2R exceeding 0.3, the ratio of sub-division being equal to 2.

* * * * *